(12) United States Patent
Nohrden et al.

(10) Patent No.: US 6,389,270 B1
(45) Date of Patent: May 14, 2002

(54) STATION SCAN METHOD AND APPARATUS FOR RADIO RECEIVERS

(75) Inventors: James M. Nohrden; Brian P. Lum Shue Chan, both of Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/266,418

(22) Filed: Mar. 10, 1999

(51) Int. Cl.$^7$ ................................................. H04B 1/18
(52) U.S. Cl. ........................... 455/161.1; 455/150.1; 455/131; 375/316; 375/350
(58) Field of Search ............... 455/161.1, 150.1, 455/131, 133, 136, 138, 141, 142, 161.2, 164.1, 164.2, 173.1, 182.3, 183.1, 184.1, 192.3, 193.1, 434, 523; 375/316, 328, 329, 330, 340, 350

(56) References Cited

U.S. PATENT DOCUMENTS

| | | | |
|---|---|---|---|
| 4,123,715 A | 10/1978 | Fathauer | |
| 4,135,158 A | 1/1979 | Parmet | |
| 4,404,430 A | 9/1983 | Ogita | |
| 4,461,026 A | * 7/1984 | Priniski | ........................ 381/98 |
| 4,476,581 A | * 10/1984 | Bragas | ........................ 455/166 |
| 4,646,150 A | 2/1987 | Robbins et al. | |
| 4,688,110 A | 8/1987 | Fricke | |
| 4,698,670 A | 10/1987 | Matty | |
| 4,821,097 A | 4/1989 | Robbins | |
| 4,823,390 A | 4/1989 | Wittrock | |
| 5,339,455 A | * 8/1994 | Vogt et al. | ................... 455/266 |
| 5,430,890 A | * 7/1995 | Vogt et al. | ............... 455/180.3 |
| 5,548,831 A | * 8/1996 | Bjiker et al. | ................. 455/207 |
| 5,613,230 A | * 3/1997 | Gottfried et al. | ........... 455/161 |
| 5,740,523 A | 4/1998 | Nakajima et al. | |
| 5,751,806 A | * 5/1998 | Ryan | .............................. 380/9 |
| 5,909,644 A | * 6/1999 | Tomiyama | ................... 455/146 |
| 6,192,089 B1 | * 2/2001 | Corleto et al. | .............. 375/344 |

* cited by examiner

Primary Examiner—William Trost
Assistant Examiner—Congvan Tran
(74) Attorney, Agent, or Firm—Steven Lin, Esq.

(57) ABSTRACT

Station scan circuitry for a radio-frequency receiver and corresponding methods are disclosed that efficiently determine the presence of a station on available channels. The station scan circuitry includes circuitry that determines if the signal power on a given channel exceeds a threshold value. Additional circuitry compares the channel signal strength and the adjacent channel signal to determine if a ratio of the two exceeds a threshold level. If both the signal power and the signal strength ratio are sufficient, the station scan circuitry indicates that a station has been found. To make the signal strength comparison, the station scan circuitry includes circuitry for determining a post-filter signal strength and a pre-filter signal strength for the received signal.

28 Claims, 2 Drawing Sheets

STATION SCAN METHOD AND APPARATUS FOR RADIO RECEIVERS

This application is related to the following U.S. patent applications that have been filed concurrently herewith and that are hereby incorporated by reference in their entirety: Ser. No. 09/265,663 filed on Mar. 10, 1999, entitled "Method and Apparatus for Demodulation of Radio Data Signals" by Eric J. King and Brian D. Green; Ser. No. 09/265,659 filed on Mar. 10, 1999, entitled "Method and Apparatus for Discriminating Multipath and Pulse Noise Distortions in Radio Receivers" by James M. Nohrden, Brian D. Green and Brian P. Lum Shue Chan; Ser. No. 09/265,752 filed on Mar. 10, 1999, entitled "Digital Stereo Recovery Circuitry and Method For Radio Receivers" by Brian D. Green; Ser. No. 09/414,209 filed on Oct. 7, 1999, which claims the benefit of provisional application Ser. No. 60/123,634 filed on Mar. 10, 1999, entitled "Quadrature Sampling Architecture and Method For Analog-To-Digital Converters" by Brian P. Lum Shue Chan, Brian D. Green and Donald A. Kerth; and Ser. No. 09/265,758 filed on Mar. 10, 1999, which has issued as U.S. Pat. No. 6,225,928 on May 1, 2001, entitled "Complex Bandpass Modulator and Method for Analog-to-Digital Converters" by Brian D. Green.

BACKGROUND OF THE INVENTION

1. Field of the Invention

The present invention relates generally to circuits for station scan functionality in a radio receiver. More specifically, the present invention relates to techniques for conducting a station scan in a digital receiver.

2. Description of the Related Art

In a given geographic area, numerous stations may be broadcasting radio frequency (RF) signals on different channels. These RF signals may be AM or FM signals and may include desired program information. A radio receiver present within this geographic area, either fixed or mobile, will attempt to receive and recover the program information being broadcast by the stations. Often it is desirable for the radio receiver to have the ability to scan for the presence of stations in the geographic area. For example, when a person is traveling in an automobile through an unfamiliar geographic area, that person will likely not know the channels on which stations are broadcasting program information. Such station scan to capabilities, however, often require a radio receiver to include additional circuitry that may add undesirable costs and complexity to the radio receiver.

SUMMARY OF THE INVENTION

In accordance with the present invention, station scan circuitry efficiently determines the presence of a station on available channels. Channels are analyzed to determine if the signal power on a given channel exceeds a threshold value. A comparison is also made between the desired channel signal strength and the adjacent channel signal strength. If the signal power and the ratio of signal strengths exceed selected threshold levels, the station scan circuitry indicates that a station has been found. To make the signal strength ratio comparison, the station scan circuitry makes a comparison of the post-filter signal strength and the pre-filter signal strength for the received signal.

DESCRIPTION OF THE PREFERRED EMBODIMENTS

Figure 1:
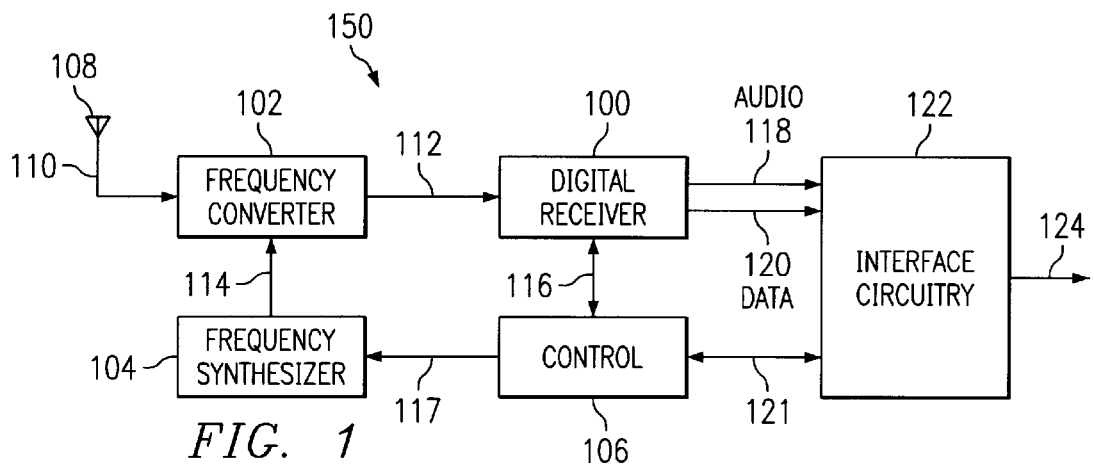
FIG. 1 is a block diagram of an embodiment for an intermediate frequency (IF) AM/FM radio receiver

Referring now to FIG. 1, a block diagram is depicted for an embodiment of an intermediate frequency (IF) AM/FM radio receiver 150. A frequency converter circuitry 102 converts a radio frequency (RF) signal 110 received from the antenna 108 to an IF frequency 112. The frequency converter circuitry 102 utilizes a mixing signal 114 from a frequency synthesizer 104 to perform this conversion from the RF frequency range to the IF frequency range. Control circuitry 106 may apply a control signal 117 to frequency synthesizer 104 to choose the mixing signal 114 depending upon the station or channel that is desired to be received by the IF receiver 150. The digital receiver circuitry 100 processes the IF signal 112 and produces desired output signals, for example, audio output signals 118 and data output signals 120, which may be radio data signal (RDS) information. These output signals may be provided to interface circuitry 122 and output to external devices through interface signals 124. The control circuitry 106 may communicate with the digital receiver circuitry 100 through signals 116 and may communicate with the interface circuitry 122 through signals 121. In addition, control circuitry 106 may communicate with external devices through the interface circuitry 122.

Figure 2:
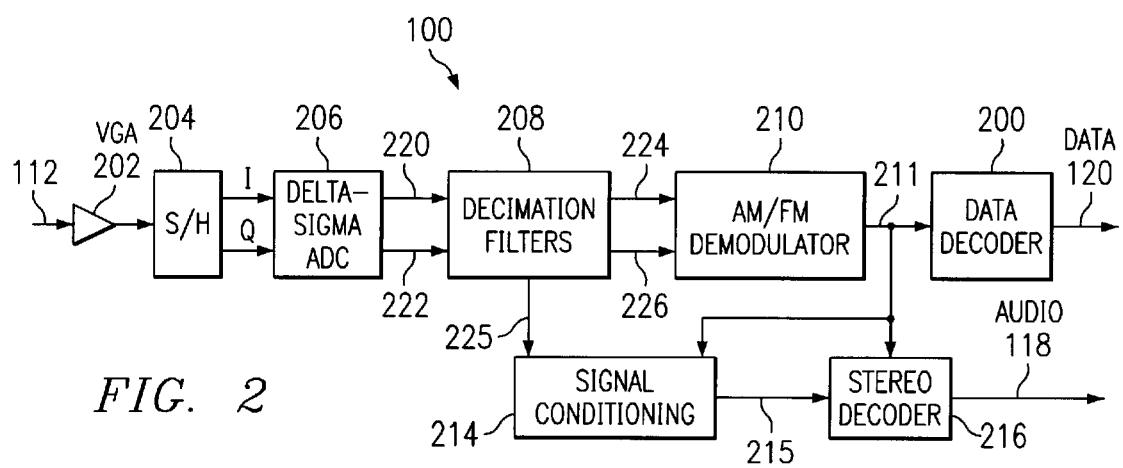
FIG. 2 is a block diagram of an embodiment for the digital receiver within the IF AM/FM radio receiver

FIG. 2 is a block diagram of an embodiment for the digital receiver 100. The IF input signal 112 is amplified by a variable gain amplifier (VGA) 202. The output of the variable gain amplifier (VGA) 202 may be filtered with anti-aliasing filters if desired. Sample-and-hold (S/H) circuitry 204 samples the resulting signal and produces a real or in-phase (I) output signal and an imaginary or quadrature (Q) output signal. The Q signal is related to the I signal by being 90 degrees out of phase with respect to the I signal. The analog-to-digital converter (ADC) circuitry 206 processes the I and Q signals to form an I digital signal 220 and a Q digital signal 222. The ADC circuitry 206 may be, for example, two fifth order delta-sigma ADCs that operate to convert the I and Q signals to one-bit digital I and Q data streams 220 and 222. The digital output signals 220 and 222 of the ADC circuitry 206 are passed through digital decimation filters 208 to complete channelization of the signals and to produce decimated I data signal 224 and Q data signal 226. The decimation filters 208 may also remove quantization noise caused by ADC 206 and provide some anti-aliasing filtering.

Demodulation of the decimated I and Q data signals may be performed by AM/FM demodulator 210. The demodulator 210 may include, for example, a CORDIC (COordinated Rotation DIgital Computer) processor that processes the digital I and Q data streams 224 and 226 and outputs both angle and magnitude data for the I and Q digital data signals. For FM demodulation, the demodulator 210 may also perform discrete-time differentiation on the angle value outputs. The demodulated signal 211 may be further processed by signal conditioning circuitry 214, which may also receive signal 225 from the decimation filter circuitry 208. The signal conditioning circuitry 214 may provide any desired signal processing, including for example detecting weak signal conditions, multi-path distortions and impulse noise and making appropriate modifications to the signals to compensate for these signal problems.

The stereo decoder 216 processes the demodulated signal 211 to decode the left and right channel information from the multiplexed stereo signal and to provide the desired audio output signals 118. The signal conditioning circuitry 214 provides signal 215 to the stereo decoder 216 to control the output of the stereo decoder depending upon the processing performed by the signal conditioning circuitry 214. The stereo decoder 216 may also provide additional signal processing as desired. The demodulated signal 211 may also be processed by a data decoder 200 to recover data from the FM multiplex signal using, for example, a synchronous digital demodulator. The output of the data decoder 200 provides the desired data output signals 120, which may be, for example, RDS clock and data signal information.

Figure 3:
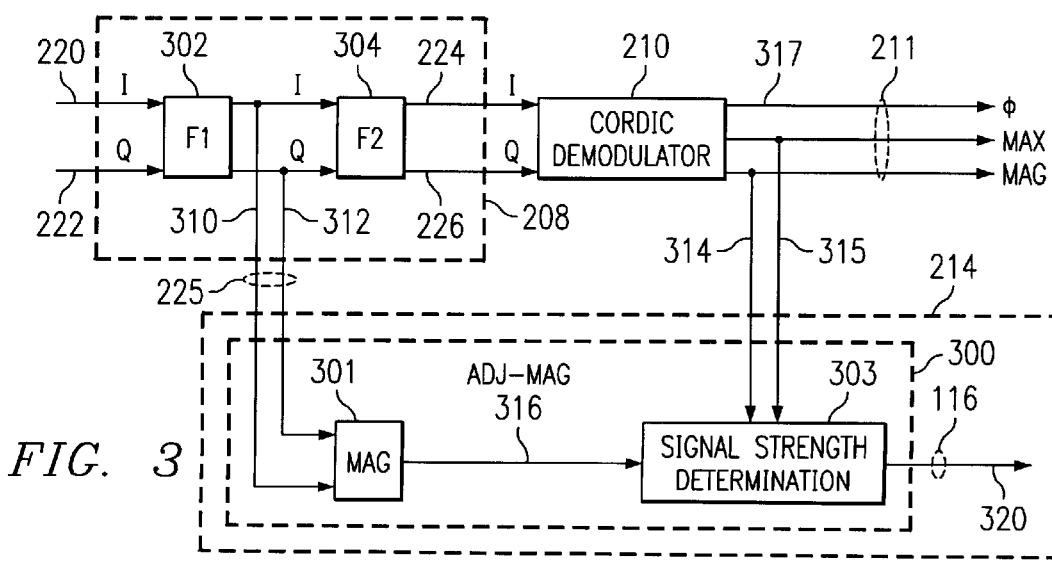
FIG. 3 is a block diagram of an embodiment for station scan circuitry according to the present invention.

FIG. 3 is a block diagram of an embodiment for station scan circuitry 300. The decimation filter circuitry 208 may include a first filter (F1) 302, which may for example be a finite response filter (FIR), cascaded with a second filter (F2) 304, which may for example be an infinite response filter (IIR). The filter (F1) 302 may receive the digital I and Q data signals 220 and 222 and produce filtered I and Q signals 310 and 312. In turn, filter (F2) 304 may receive the filtered I and Q data signals 310 and 312 and produce the decimated I and Q data signals 224 and 226. The I and Q signals 310 and 312 from filter (F1) 302 may be the signal 225 provided from the decimation filters 208 to the signal conditioning circuitry 214. The I and Q signals 224 and 226 from filter (F2) 304 are provided to the AM/FM demodulator 210, which as depicted is a CORDIC demodulator. The CORDIC AM/FM demodulator 210 outputs a demodulated signal 211, which includes a phase value ($\phi$) 317, a magnitude value (mag) 314, and a multiplexed signal (315) that is the result of differentiating the phase value. It is noted that CORDIC AM/FM demodulators have been used in prior devices and are well-known. It is also noted that for the purpose of the present invention, as discussed below, a demodulator or a CORDIC demodulator is not required, as long as an indication of the power level associated with the desired channel signal is provided.

The station scan circuitry 300 is within the signal conditioning circuitry 214. Magnitude determination circuitry (MAG) 301, which may be a CORDIC processor, converts the I and Q data signals 310 and 312 to a magnitude value ($adj_{13}$ mag) 316. The magnitude value ($adj_{13}$ mag) 316 and the magnitude value (mag) 314 are provided to the signal strength determination circuitry 303, which is within the station scan circuitry 300.

As discussed in more detail with respect to FIG. 5 below, the magnitude value (adj_mag) 316 represents the magnitude of the signal strength where the adjacent channel signals 522 and 532 have only been slightly filtered out. The magnitude value (mag) 314 represents the magnitude of the signal strength where the adjacent channel signals 522 and 532 have been mostly filtered out. The signal strength determination block 303 determines whether a station has been found and outputs an appropriate station found signal 320. This station found signal 320 may be utilized by other circuitry within the signal processing circuitry 214 or may be provided as an output to other circuitry within the digital receiver 100 or within the AM/FM radio receiver 150. For example, station found signal 320 may be within signals 116 that are communicated between the digital receiver 100 and the control circuitry 106. It is noted that magnitude value (mag) 314 and the magnitude value (adj_mag) 316 represent indications of the power level for the desired channel signal and the adjacent channel signals, respectively. These power level indications may be obtained by other techniques as desired for a particular implementation or application.

Figure 5:
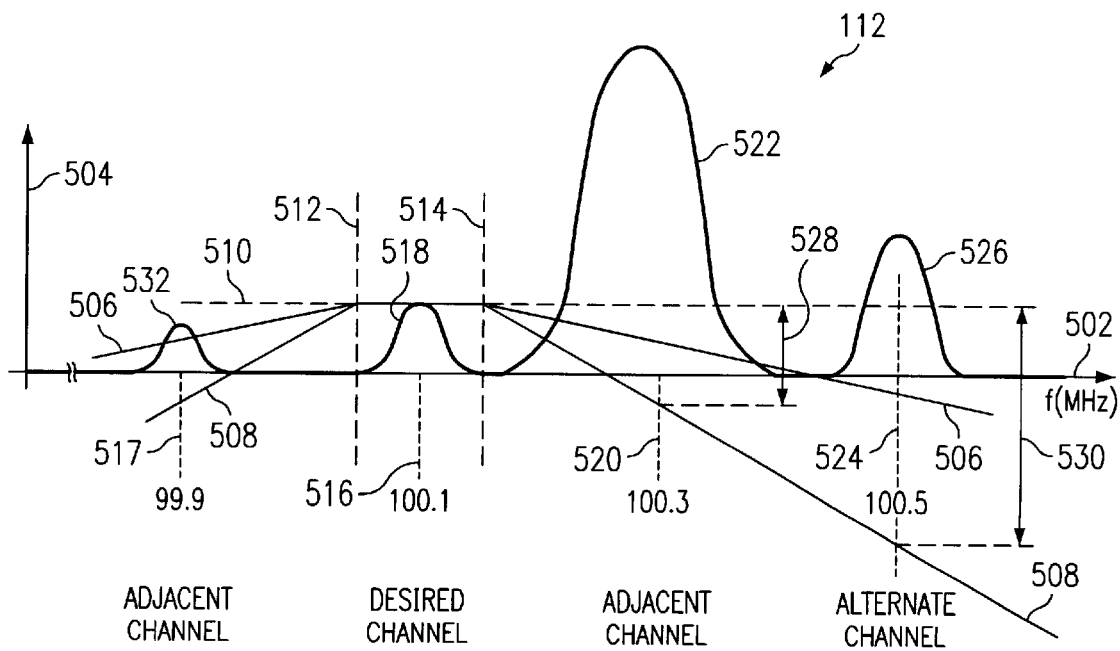
FIG. 5 is a graphical representation of a relative signal strengths for an example received signal.

Referring now to FIG. 5, a graphical representation is depicted showing, as an example, relative signal strengths for the IF signal 112. The y-axis 504 represents magnitude, and the x-axis 502 represents frequency in MHz. The signal strength at the desired channel (e.g., 100.1 MHz) 516 is represented by signal 518. Dotted line 510 is included as a reference to provide an indication of the relative signal strength level for the desired channel signal 518. It is noted that the desired channel 516 is dependent upon the current channel setting for the radio receiver 150. The two channels immediately next to the desired channel 516 are adjacent channel (e.g., 99.9 MHz) 517 and adjacent channel (e.g., 100.3 MHz) 520. The signal strengths for adjacent channels 517 and 520 are represented by signals 532 and 522 respectively. The channels that lie two channel widths from the desired channel 516 are deemed the alternate channels, for example alternate channel 524. The signal strength for alternative channel 524 is represented by signal 526. In the example depicted, the adjacent channel signal 532 has a smaller signal strength than the desired channel signal 518. The alternate channel signal 526 has a larger signal strength than the desired channel signal 518. And the adjacent channel signal 522 has a much larger signal strength than the desired channel signal 518.

The filter (F1) circuitry 302 and the filter (F2) circuitry 304, which may include FIR and/or IIR filters cascaded together, act to suppress undesired channels. The dotted lines 512 and 514 represent the corners for the filter circuitry 302 and 304, such that the desired channel signal 518 is isolated from the other signals in the IF signal 112. The line 506 represents the signal rejection provided by only the filter (F1) circuitry 302. In contrast, the line 508 represents the signal rejection provided by the filter (F1) circuitry 302 in combination with the effect of the filter (F2) circuitry 304. The I and Q data signals 310 and 312 would, therefore, be filtered only by the signal rejection associated with line 506. The decimated I and Q data signals 224 and 226 output by the decimation filter circuitry 208 would be filtered by the signal rejection associated with line 508. The rejection level 528 between the desired channel 516 and the adjacent channel 520 is the adjacent channel selectivity for the digital receiver. The rejection level 530 between the desired channel 516 and the alternative channel 524 is the alternative channel selectivity.

Referring back to FIG. 3, the signal (adj_mag) 316 represents the magnitude of the IF input signal 112 with filtering provided only by the filter (F1) 302. In FIG. 5, this correlates to the signal 112 having been filtered by the signal rejection associated with line 506. The signal (mag) 314 represents the magnitude of the IF input signal 112 with filtering provided by both the (F1) filter circuitry 302 and the filter (F2) circuitry 304. In FIG. 5, this correlates to the signal 112 having been filtered by the signal rejection associated with line 508. Because the signal (adj_mag) 316 will be influenced more by the adjacent channel signals 522 and 532 than the signal (mag) 314, the signal (adj_mag) 316 is associated with the magnitude of the adjacent channel signals 522 and 532. Because the signal (mag) 314 will be influenced less by the adjacent channel signal 522 than the signal (adj_mag) 316, the signal (mag) 314 is associated with the magnitude of the desired channel signal 518.

To determine whether a station has been located, the signal strength determination circuitry 303 may initially determine if the signal level for the magnitude signal (mag) 314 at the current desired channel 516 exceeds a power threshold. This power threshold value may be set such that the signal power level for the magnitude signal (mag) 314 at the desired channel 516 is higher than any reasonably strong leakage signal from alternate channels. Alternatively, if spurious noise leakage is typically worse than alternate channel leakage, then the power threshold value may be selected or programmed based upon a reasonable amount of expected spurious noise. Typically, the power threshold value selected will depend upon a trade-off between the false detection of stations and no detection of stations. In addition, the power threshold value may be programmable so that it is loaded into the digital receiver 100 by external control circuitry 106.

Once a station is found that exceeds the power threshold value, the signal strength determination circuitry 303 may utilize a comparison of the relative signal strengths or power levels for the desired channel magnitude signal (mag) 314 and adjacent channel magnitude signal (adj_mag) 316 to determine whether a signal of adequate strength has been received for a particular station. If these two magnitudes are close together, the signal strength determination block may conclude that the strength of the desired channel signal 518 is relatively large compared to the strength of the adjacent channel signals 522 and 532, such that the desired channel signal 518 dominates both the pre-filter and post-filter magnitude determinations 316 and 314. In contrast, if these two magnitudes differ by a selected amount, which may be a set or a programmable amount loaded internally or through the external control circuitry 106, the signal strength determination block may conclude that the strength of the desired channel signal 518 is relatively small compared to the strength of the adjacent channel signals 522 and 532, such that the adjacent channel signals 522 and 532 significantly influence the post-filter magnitude determination 316. For this latter case, it is noted that the significant difference will correlate to the adjacent channel magnitude signal (adj_mag) 316 being significantly larger than the desired channel magnitude signal (mag) 314.

For example, as depicted in FIG. 5, the adjacent channel signal 522 is large compared to the desired channel signal 518. Thus, the adjacent channel magnitude signal (adj_mag) 316 would be significantly larger than the desired channel magnitude signal (mag) 314. In contrast, if the desired channel becomes the channel 520 and the desired channel signal is now signal 522, the adjacent channel magnitude signal (adj_mag) 316 and the desired channel magnitude signal (mag) 314 will be relatively close together.

Figure 4:
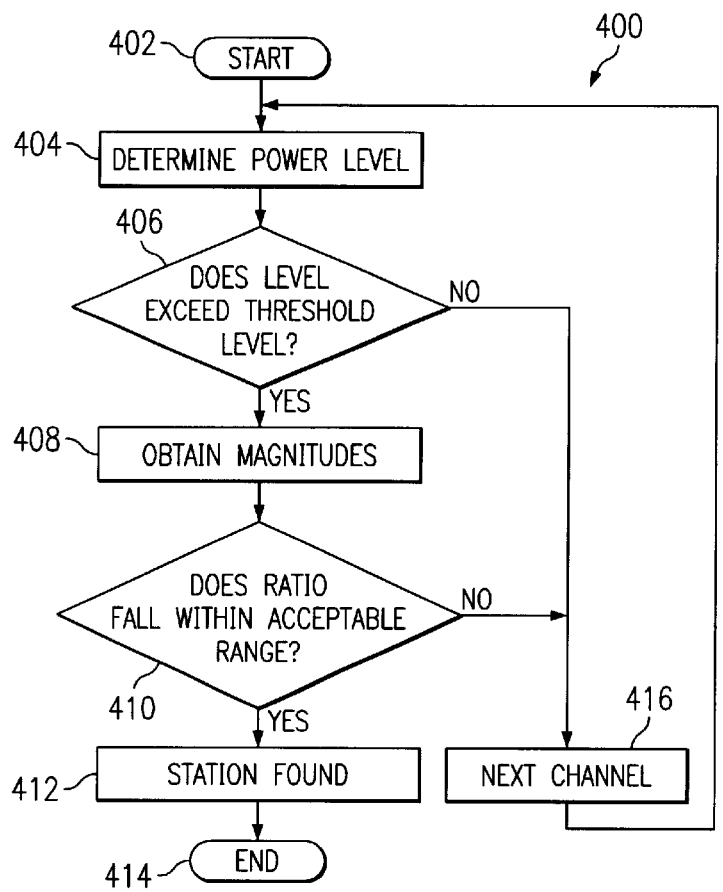
FIG. 4 is a flow diagram for a station scan algorithm according to the present invention.

FIG. 4 is a flow diagram of an embodiment for a station scan algorithm 400 that may be implemented by signal strength determination block 303 to determine if a station has been found. An initial channel is selected in the start block 402. In block 404, the power level for the desired channel, such as the magnitude signal (mag) 314, is determined from the desired channel signal. Decision block 406 then checks to see whether the power level exceeds the power threshold value. If not, the radio receiver 150 moves onto the next channel in block 414. Once the next channel has been selected, control passes back to block 404 for a determination of the power level for the new channel. Once the power value for a channel exceeds the power threshold value, control passes to block 408. It is again noted that although a CORDIC demodulator is depicted in FIG. 3 for providing the magnitude signal (mag) 314 as an indication of the power level for the desired channel, an indication of the power level of the desired channel could be determined from the output of the filter 304 using other techniques, as desired.

In block 408, the post-filter and pre-filter signal magnitude values 314 and 316 are determined. As discussed above, the desired channel magnitude value (mag) 314 is determined from the I and Q data signals 310 and 312, and the adjacent channel magnitude value (adj_mag) 316 is determined from the I and Q data signals 224 and 226. In decision block 610, these magnitude values are compared to see if their ratio falls within an acceptable range. For example, the ratio may be compared to the adjacent channel rejection specification for the digital receiver 100, which may be for example 30 dB. If the ratio falls outside this range (e.g., >30 dB), indicating that the adjacent channel magnitude value (adj_mag) 314 is large with respect to the desired channel magnitude value (mag) 316, control passes to block 414. A new channel is again selected in block 414, and control passes back to block 404. Once a ratio is found that falls within the selected range, control passes to block 412 where an appropriate indication is provided by station scan circuitry 300 through station found signal 320. The station scan algorithm ends with block 414.

While the invention has been particularly shown and described with reference to a preferred embodiment, it will be understood by those skilled in the art that various changes in form and detail may be made therein without departing from the spirit and scope of the invention.

What is claimed is:

1. A digital audio receiver for processing audio information, comprising:

analog to digital converter circuitry having an in-phase (I) digital output signal and a quadrature (Q) digital output signal;

filter circuitry coupled to receive digital signals from the analog to digital converter circuitry and having pre-filter output signals and post-filter output signals wherein the pre-filter output signals comprise pre-filter digital I and Q signals and the post-filter output signals comprise post-filter digital I and Q signals and wherein the filter circuitry comprises:

first filter circuitry coupled to receive the I and Q digital output signals from the analog to digital converter circuitry, the pre-filter digital I and Q signals being the output signals from the first filter circuitry; and second filter circuitry coupled to receive the pre-filter digital I and Q signals, the post-filter I and Q signals being the output of the second filter circuitry; and wherein the first filter circuitry comprises finite impulse response filters or infinite impulse response filters and the second filter circuitry comprises finite impulse response filters or infinite impulse response filters; and station scan circuitry coupled to the pre-filter output signals and the post-filter output signals and having a station found signal as an output, the station found signal being asserted depending upon a comparison between magnitudes of the pre-filter output signals and the post-filter output signals.

2. The digital audio receiver of claim 1, wherein the station found signal is asserted if a difference between the magnitude of the pre-filter digital I and Q signals and the magnitude of the post-filter I and Q signals is below a desired threshold level.

3. A radio receiver system for processing audio information transmitted by a radio station, comprising:
an antenna;
a frequency converter coupled to receive a signal from the antenna, the frequency converter being tunable to select a desired radio station frequency; and
a digital receiver coupled to receive a signal from the frequency converter and having
a digital audio signal as an output, the digital receiver comprising:
analog to digital converter circuitry;
filter circuitry coupled to receive a digital signal from the analog to digital converter circuitry and having a pre-filter output signal and a post-filter output signal wherein the post-filter output signal is a desired channel signal corresponding to a desired channel at the desired radio station frequency and the pre-filter output signal is at least reflective of an adjacent channel signal corresponding to an adjacent channel that is adjacent to the desired channel at an adjacent frequency; and
a station scan circuitry coupled to the pre-filter output and the post-filter output signal and having a station found signal as an output, the station found signal being asserted when a magnitude of the desired channel signal and a magnitude of the adjacent channel signal are compared and determined to be substantially equal in value; and
control circuitry coupled to receive the station found signal and to control the tuning of the frequency converter.

4. The radio receiver system according to claim 3 wherein if the station scan circuitry has not asserted the station found signal, then the station scan circuitry continues to check a next channel by making the adjacent channel signal as the desired channel signal and a next adjacent channel signal as the adjacent channel signal and by comparing a magnitude of the desired channel signal with a magnitude of the adjacent channel signal to determine whether the magnitudes are substantially equal in value and, if so, then the station scan circuitry asserts the station found signal.

5. The radio receiver system according to claim 3 wherein the station scan circuitry initially determines whether the desired channel signal has sufficient signal strength based upon a magnitude of the desired channel signal exceeding a predetermined threshold power level.

6. The radio receiver system according to claim 3, wherein the magnitudes of the desired channel signal and the adjacent channel signal are determined to be substantially equal in value by performing a comparison of a ratio of the desired channel signal and the adjacent channel signal to a selected range.

7. The radio receiver system according to claim 3, wherein the selected range is from 0dB to 30dB and the ratio must be within the selected range for the station found output signal to be asserted.

8. A digital audio receiver for processing audio information, comprising
analog to digital converter circuitry;
filter circuitry coupled to receive a digital signal from the analog to digital converter circuitry and having a pre-filter output signal and a post-filter output signal wherein the post-filter output signal is a desired channel signal corresponding to a desired channel at a desired radio station frequency and the pre-filter output signal is at least reflective of an adjacent channel signal corresponding to an adjacent channel that is adjacent to the desired channel at an adjacent frequency; and
a station scan circuitry coupled to the pre-filter output signal and the post-filter output signal and having a station found signal as an output, the station found signal being asserted when a magnitude of the desired channel signal and a magnitude of the adjacent channel signal are compared and determined to be substantially equal in value.

9. The digital audio receiver of claim 8, further comprising demodulator circuitry coupled to receive the desired channel signal and having the magnitude of the desired channel signal as an output, and wherein the station scan circuitry is coupled to receive the magnitude of the desired channel signal.

10. The digital audio receiver of claim 8, wherein the station scan circuitry initially determines whether the desired channel signal has sufficient signal strength based upon a magnitude of the desired channel signal exceeding a predetermined threshold power level.

11. The digital audio receiver of claim 8 wherein if the station scan circuitry has not asserted the station found signal, then the station scan circuitry continues to check a next channel by making the adjacent channel signal as the desired channel signal and a next adjacent channel signal as the adjacent channel signal and by comparing a magnitude of the desired channel signal with a magnitude of the adjacent channel signal to determine whether the magnitudes are substantially equal in value and, if so, then the station scan circuitry asserts the station found signal.

12. The digital audio receiver of claim 8, wherein the magnitudes of the desired channel signal and the adjacent channel signal are determined to be substantially equal in value by performing a comparison of a ratio of the desired channel signal and the adjacent channel signal to a selected range.

13. The digital audio receiver of claim 8, wherein the analog to digital converter circuitry has an in-phase (I) digital output signal and a quadrature (Q) digital output signal.

14. The digital audio receiver of claim 13, wherein the pre-filter output signal comprises pre-filter digital I and Q signals and the post-filter output signal comprises post-filter digital I and Q signals.

15. The digital audio receiver of claim 14, wherein station scan circuitry determines a magnitude for a combination of the pre-filter digital I and Q signals.

16. The digital audio receiver of claim 15, wherein the station scan circuitry further comprises a CORDIC processor coupled to receive the pre-filter digital I and Q signals and having the magnitude of the desired channel signal as an output.

17. The digital audio receiver of claim 14, wherein the filter circuitry comprises:
first filter circuitry coupled to receive the I and Q digital output signals from the analog to digital converter circuitry, the pre-filter digital I and Q signals being the output signals from the first filter circuitry; and
second filter circuitry coupled to receive the pre-filter digital I and Q signals, the post-filter I and Q signals being the output of the second filter circuitry.

18. The digital audio receiver of claim 17, wherein the first filter circuitry comprises finite impulse response filters or infinite impulse response filters and the second filter circuitry comprises finite impulse response filters or infinite impulse response filters.

19. The digital audio receiver of claim 18, wherein the station found signal is asserted if a difference between the magnitude of the pre-filter digital I and Q signals and the magnitude of the post-filter I and Q signals is below a desired threshold level.

20. A station scan method for digital receivers, comprising:
selecting a radio station frequency;
tuning a frequency converter to the radio station frequency;
converting analog audio information at the selected radio station frequency to a digital signal;
filtering the digital signal from the analog to digital converter circuitry to produce a pre-filter output signal and a post-filter output signal wherein the post-filter output signal is a desired channel signal corresponding to a desired channel at the selected radio station frequency and the pre-filter output signal is at least reflective of an adjacent channel signal corresponding to an adjacent channel that is adjacent to the desired channel at an adjacent frequency;
determining a magnitude of the desired channel signal and a magnitude of the adjacent channel signal;
asserting a station found signal when the magnitude of the desired channel signal and the magnitude of the adjacent channel signal are compared and determined to be substantially equal in value; and
selecting a different station and repeating the above steps until the station found signal is asserted.

21. The station scan method of claim 20, further comprising:
initially determining whether the desired channel signal has sufficient signal strength based upon a magnitude of the desired channel signal exceeding a predetermined threshold power level.

22. The station scan method of claim 20 further comprising:
if the station found signal has not been asserted, then continuing to check a next channel by making the adjacent channel signal as the desired channel signal and a next adjacent channel signal as the adjacent channel signal and comparing a magnitude of the desired channel signal with a magnitude of the adjacent channel signal to determine whether the magnitudes are substantially equal in value and, if so, then asserting the station found signal.

23. The station scan method of claim 20, wherein the determining step further comprises:
determining magnitudes of the desired channel signal and the adjacent channel signal to be substantially equal in value by performing a comparison of a ratio of the desired channel signal and the adjacent channel signal to a selected range.

24. A station scan circuitry for radio receivers, comprising:
a first input signal indicative of a power level for a desired channel signal with filtering of adjacent channel signals;
a second input signal indicative of a power level for a desired channel signal including adjacent channel signals; and
a station found output signal being asserted when a magnitude of the desired channel signal and magnitudes of the adjacent channel signals are compared and determined to be substantially equal in value.

25. The station scan circuitry according to claim 24, wherein the station found signal has not been asserted and a next channel is continued to be checked by making the adjacent channel signal as the desired channel signal and a next adjacent channel signal as the adjacent channel signal and a magnitude of the desired channel signal is compared with a magnitude of the adjacent channel signal to determine whether the magnitudes are substantially equal in value and, if so, then the station found signal is asserted.

26. The station scan circuitry according to claim 24 wherein the desired channel signal is initially determined to have sufficient signal strength based upon a magnitude of the desired channel signal exceeding a predetermined threshold power level.

27. The station scan circuitry according to claim 24, wherein the magnitudes of the desired channel signal and the adjacent channel signal are determined to be substantially equal in value by comparing a ratio of the desired channel signal and the adjacent channel signal to a selected range.

28. The station scan circuitry according to claim 27, wherein the selected range is from 0dB to 30dB and the ratio must be within the selected range for the station found output signal to be asserted.

* * * * *